Feb. 5, 1963 R. L. WATTERS 3,076,944

FREQUENCY TRANSFORMING CIRCUITS UTILIZING NEGATIVE RESISTANCE

Filed Dec. 18, 1959

Inventor:
Robert L. Watters,
by John F. Ahern
His Attorney.

United States Patent Office 3,076,944

Patented Feb. 5, 1963

3,076,944

FREQUENCY TRANSFORMING CIRCUITS UTILIZING NEGATIVE RESISTANCE

Robert L. Watters, Schenectady, N.Y., assignor to General Electric Company, a corporation of New York Filed Dec. 18, 1959, Ser. No. 860,591
4 Claims. (Cl. 331—107)

This invention relates to frequency transforming circuits and in particular to such circuits using semiconductor devices.

Frequency transforming circuits are used extensively in frequency modulation and communication transmitters, and for frequency measurement work in addition to numerous other electronic applications. "Frequency transformation" as used herein refers to deriving from a frequency ($f$), a frequency which is exactly equal to $$\frac{f}{n}$$

or $fn$, where $n$ is an integer greater than unity. This invention may be used, therefore, for either multiplying or dividing an input frequency.

One of the most satisfactory prior means for providing such frequency transformation was by means of the multivibrator type of relaxation oscillator. This invention deals with a new and novel semiconductor regenerative frequency transforming circuit which provides frequency multiplying and dividing and which utilizes a narrow junction degenerate semiconductor device as the only active element thereof. This invention further provides an advance in circuit simplicity and allows a higher degree of stability, miniaturization and higher frequency operation than any previous frequency transforming circuits.

The semiconductor device used by this invention is a narrow junction degenerate semiconductor diode. Such a device exhibits a negative resistance characteristic at low forward voltages.

In order for a semiconductor diode to exhibit such a characteristic, it must be impregnated with a significant impurity on both the P-type and N-type side with an excess concentration of significant activator impurities, respectively sufficiently high to make both regions degenerate. By a "degenerate semiconductor" is meant a body of semi-conductor to which has been added sufficient excess donor impurity so that the Fermi-level for electrons is higher in energy than the conduction band edge; or to which has been added sufficient excess acceptor impurity so that the Fermi-level has been depressed to a lower energy than the valence band edge.

As used herein, a narrow junction semiconductor device refers to a semiconductor device having excess donor and acceptor concentrations on either side of the junction, respectively so that both the N-type side and the P-type side of the junction are degenerate. Such a device exhibits a region of strong negative resistance in the low forward voltage range of its current-voltage characteristic.

The narrow junction degenerate semiconductor diode used by this invention exhibits a negative resistance characteristic in the forward voltage range of less than one volt. For example, the range of the negative resisance characteristic for a germanium device is from about .04 to 0.3 volt while for a silicon device the range is from about .08 to 0.4 volt.

For further details concerning the semiconductor device utilized in this invention reference may be had to the abandoned application of Tiemann, Serial No. 858,995, filed December 11, 1959, assigned to the assignee of the present application the disclosure of which is incorporated herein by reference.

I have found that with appropriate co-operative circuitry the above described narrow junction semiconductor diode may be used for performing large frequency multiplication or division functions. Therefore, an object of this invention is to provide a new and improved regenerative frequency transforming circuit using a narrow junction degenerate semiconductor diode.

It is another object of this invention to provide a frequency transforming circuit which is suitable for operation over an extremely wide frequency range and at low power levels.

It is another object of this invention to provide a regenerative frequency transforming circuit which is simple, more efficient and more stable than previous circuits of this type.

It is still another object of this invention to provide a new and improved frequency transforming circuit which allows a substantial reduction in circuit components.

It is a further object of this invention to provide a frequency transforming circuit which permits large factors of multiplication or division in a single stage.

Briefly stated, in accord with one aspect of this invention, the frequency transforming circuit comprises a narrow junction degenerate semiconductor diode relaxation oscillator and means for applying a synchronizing signal thereto. The relaxation oscillator includes a voltage source, an inductance, a narrow junction degenerate semi-conductor diode and means in circuit therewith biasing the diode for operation in the negative resistance region of its current-voltage characteristic. When used as a frequency divider, the repetition rate of the oscillator is selected to be near the desired divided frequency of the input. The frequency of the diode relaxation oscillator adjusts itself in a ratio of integers to the input frequency. The output frequency is then exactly equal to the desired divided frequency.

My invention will be better understood from the following description taken in conjunction with the accompanying drawings and its scope will be apparent from the appended claims.

Figure 1:
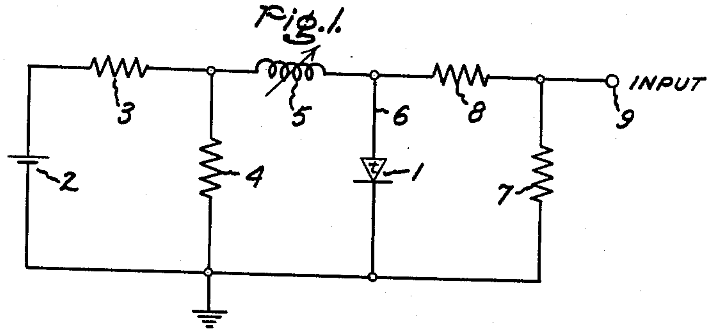
FIG. 1 is a schematic illustration of one embodiment of this invention.

FIG. 1 utilizes the non-linear characteristic of semiconductor 1 in a regenerative frequency transforming circuit.

In FIG. 1, semiconductor diode 1 is connected in circuit with a voltage supply 2. Resistors 3 and 4 are connected between the diode and the voltage supply and serve to limit the current to the diode and provide a bias therefor such that the average operating point is in the negative resistance region of the current-voltage characteristic of diode 1. Inductor 5 is connected from the junction of resistors 3 and 4 to electrode 6 of diode 1. A voltage divider, including series resistors 7 and 8, is connected from electrode 6 to the other side of the voltage supply. The above are the only components required for this novel frequency transforming circuit. This simplicity is striking when compared with any other known frequency transforming circuits.

Frequency transforming circuits based upon the use of relaxation oscillators usually have a tendency to allow the ratio of division or multiplication to change with variations of circuit constants. This results primarily from the inherent instability of the prior relaxation oscillator circuits. Such relaxation type of frequency transforming circuits, therefore, have not been entirely dependable.

These disadvantages are overcome in the frequency transforming circuit of this invention. The relaxation oscillator using the narrow junction diode is extremely stable and therefore the frequency of oscillation is very dependable. As shown by the wave form of FIG. 3*b*, because of the non-linear characteristic of diode 1, the input signal is amplified just at the time when switching occurs. This provides for extreme stability in the frequency transforming circuit and allows for large factors of multiplication or division.

Having set forth the circuit configuration of FIG. 1 its operation will be briefly described. While this invention is subject to a wide range of applications it will be particularly described in connection with the frequency division of an injected synchronizing signal. It will be obvious to those skilled in the art, however, that frequency multiplication can be accomplished by various methods of utilizing the output of this circuit which is extremely rich in harmonic content. For example, the circuit may be synchronized with an input signal and the output will contain a full range of harmonics, all related to the input frequency.

Figure 2:
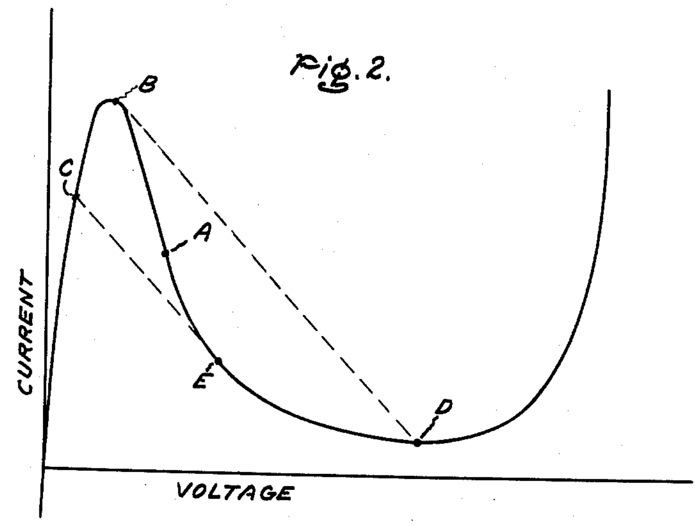
FIG. 2 illustrates the current-voltage characteristic of a semiconductor device which can be used by this invention showing the path of the operating point thereof during oscillation.

In operation, means are provided to produce a direct current bias for diode 1 such that the average operating point is in the negative resistance region of the current-voltage characteristic, such as shown at A of FIG. 2. This may be provided, for example, by voltage source 2 and resistance 3 and 4.

The operation of the circuit of FIG. 1 may best be understood by reference to the current-voltage characteristic of a narrow junction semiconductor diode suitable for use in accord with this invention. A typical current-voltage characteristic of such a device is shown in FIG. 2.

Assume initially that diode 1 is biased such that its average operating point is in the region of negative resistance such as shown at A. Any small decrease in voltage across the diode due to any cause is accompanied by an increase in current through the diode and the operating point will move along the characteristic toward B. Inductance 5, however, tends to oppose any change in the current through it and the voltage across the inductance increases, further reducing the voltage across the diode and causing the operating point to continue to move in the direction of decreasing voltage toward point B. This action is cumulative and the current rises very quickly until a point on the positive resistance region, such as C, is reached. This point is determined by the losses in the circuit.

When the point C is reached, however, the operating point seeks to return to its average position in the negative resistance region. The action of inductance 5 opposes this return, so that the operating point moves slowly until it reaches a position such as B where again the action of inductance 5 co-operates and the operating point moves almost instantaneously to a position such as indicated at D. The operating point again seeks is average position in the negative resistance region and moves along the characteristic until a position such as E is reached when it almost instantaneously jumps to point C. This action continues and results in a free running relaxation oscillator. The repetition rate of the oscillator may be determined by suitable selection of inductance 5, resistance 4 and the bias on diode 1.

The resulting relaxation oscillator is extremely stable and dependable and capable of operation over an extremely wide frequency range. Because of the sudden changes in amplitude during the operating cycle, the output, as shown by the voltage wave forms of FIG. 3*a*, is rich in harmonics.

Such a relaxation oscillator may be readily synchronized with an injected voltage. When an alternating voltage from an outside source is introduced into the oscillator circuit, the oscillations thereof can become adjusted in frequency so that the ratio of injected to relaxation frequency is exactly a ratio of integers. The circuit may readily multiply and divide frequencies simultaneously.

The injected voltage, superimposed upon the relaxation oscillator diode voltage, controls the instant at which the diode switches from points B to D and E to C. In this way the length of the relaxation oscillation is controlled by the injected voltage and synchronization results.

Since the relaxation oscillator described above is so stable, the number of cycles of the injected voltage which will be superimposed upon a relaxation oscillation is extremely dependable. In addition, by appropriate selection of co-operating circuitry, the injected voltage can be amplified when the diode is about to switch.

Figure 3:
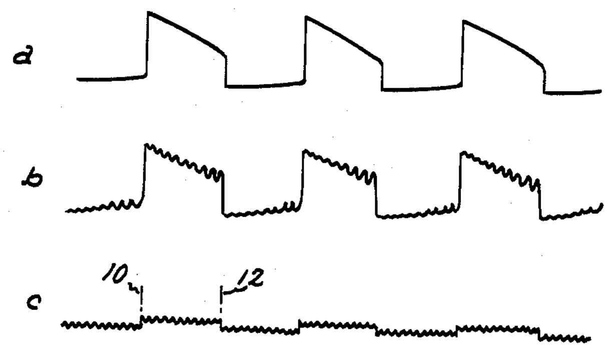
FIG. 3 shows the wave forms obtained at specified points in the circuit shown in FIG. 1.

The amplification of the injected voltage can be illustrated particularly by reference to FIG. 3. FIG. 3*c* is a wave form at the input terminals 9 of the circuit of FIG. 1. The increase in voltage at the range 10—12 is due to the effect of diode 1 through the voltage dividing resistors 7—8. FIG. 3*b* illustrates the amplification of the injected voltage just as the diode is about to switch. This amplification of the injected voltage is due to the operation of the non-linear narrow junction diode in this circuit and contributes to the extreme efficiency and stability of the frequency transforming circuit. For example, a minute amount of injected synchronizing power dominates the switching time.

The wave form of the relaxation oscillations is very rich in harmonics as a result of the sudden changes in amplitude that occur during each cycle of operation. By synchronizing the relaxation oscillator frequency with a standard frequency, for example, a whole series of frequencies can be obtained all exactly related to the standard frequency.

A specific embodiment of a frequency dividing circuit constructed in accord with this invention illustrates the large factors of frequency division possible from a single stage. The circuit described hereinbelow has an input frequency within the frequency modulation band of 88 to 108 mc. and an output which may be detected on a standard broadcast receiver.

The input means of the schematic circuit of FIG. 1 are modified such that instead of a synchronizing signal and a resistive voltage divider, a tuned circuit, resonant to the frequency modulation band of 88 to 108 mc., is connected in circuit with a blocking capacitor and narrow junction diode 1. The purpose of the blocking capacitor is to prevent shorting out the direct current through the inductance of the tuned circuit.

By way of example only, assuming a voltage source of 1.5 volts and a narrow junction diode having an absolute value of negative resistance on the order of 150 ohms the following circuit parameters could be set as follows:

Resistance 3=0–1500 ohms (variable)
Resistance 4=100 ohms
Inductance 5=55 to 110 microhenries (variable)

In operation the narrow junction diode oscillates in the broadcast band and one of its harmonics, for example the 90th, is locked on a frequency modulation station. The resulting narrow band frequency modulation of the fundamental is detected on the side of the resonance curve of a standard broadcast receiver. This circuit, therefore, provides a frequency division in one stage in the order of 90 to 1 without sacrifice of stability or gain.

While in the circuit of FIG. 1, the means for impressing a synchronizing voltage upon diode 1 has been shown as a resistive voltage divider, it is apparent that other circuit networks and elements as, for example, resonant circuits, transformers and the like may be utilized for the same purpose.

While the invention has been set forth herein in certain preferred embodiments, many modifications and changes will immediately occur to those skilled in the art. Accordingly, by the appended claims I intend to cover all such modifications and changes as fall within the true scope of the invention.

What I claim as new and desire to secure by Letters Patent of the United States is:

1. A regenerative frequency divider circuit comprising: a narrow junction degenerate semiconductor diode device exhibiting a negative resistance region in the low forward voltage range of its current-voltage characteristic; bias means in circuit with said diode device establishing an average direct current operating point therefor in said negative resistance region; and inductance connected in series circuit between said diode device and said bias means, said inductance acting in opposition to any current change in said diode device whereby said diode device is caused to switch from a lower voltage operating condition to a higher voltage operating condition and from a higher voltage operating condition to a lower voltage operating condition with a repetition rate substantially determined by said inductance and the effective resistance in series with said diode device thereby producing relaxation-type oscillations; and means including a voltage dividing network for impressing a synchronizing signal on said diode having a frequency different than the repetition rate of said relaxation-type oscillations to produce an output therefrom having a frequency which is an exact division of the frequency of the impressed synchronizing signal.

2. A regenerative frequency transforming circuit comprising: a narrow junction degenerate semiconductor diode device exhibiting a negative resistance region in the low forward voltage range of its current-voltage characteristic; bias means in circuit with said diode establishing an average direct current operating point therefor in said negative resistance region; an inductance connected in series circuit between said diode device and said bias means, said inductance acting in opposition to any current change in said diode device whereby said diode device is caused to switch from a low voltage operating condition to a high voltage operating condition and from said high voltage operating condition to a low voltage operating condition thereby producing relaxation-type oscillations having a repetition rate determined substantially by said inductance and the effective resistance in series with said diode device; and input means including a voltage dividing network for impressing a synchronizing voltage signal on said diode device, said voltage dividing network providing a load across said diode device whereby said input signal is amplified just at the time switching occurs thereby controlling the repetition rate of said relaxation-type oscillations and providing an output having a frequency related by a ratio of integers to the frequency of the synchronizing signal.

3. A regenerative frequency transforming circuit comprising a voltage source; a first resistance; an inductance; a narrow junction degenerate semiconductor diode device exhibiting a negative resistance region in the low forward voltage range of its current-voltage characteristic; means connecting said voltage source, said first resistance, said inductance and said diode device in series circuit relationship; a second resistance connected from one side of said voltage source to the juncture of said first resistance and said inductance, said voltage source, first and second resistances and said inductance providing a biasing circuit for said diode device which at direct current establishes an average operating point for said diode device in said negative resistance region whereby relaxation-type oscillations are produced thereby having a repetition rate determined substantially by the value of said inductance and the effective resistance in series with said diode device; a voltage dividing network in circuit with said diode device; means for connecting said voltage dividing network to a synchronizing signal source to synchronize said oscillations to a repetition rate which is related by a ratio of integers to the frequency of said synchronizing signal.

4. A regenerative frequency transforming circuit comprising: a voltage source; a first resistance; an inductance; a narrow junction degenerate semiconductor diode exhibiting a negative resistance region in the low forward voltage range of its current-voltage characteristic; means connecting said voltage source, said first resistance, said inductance and said diode device in series circuit relationship; a second resistance connected from one side of said voltage source to the juncture between said first resistance and said inductance, said voltage source, first and second resistances and said inductance providing a biasing circuit for said diode device at direct current for establishing an average direct current operating point for said diode device in said negative resistance region whereby relaxation-type oscillations are produced thereby having a repetition rate determined substantially by the value of said inductance and the effective resistance in series with said diode device; and means including a resistive voltage dividing network for impressing a synchronizing signal on said diode device to provide an output frequency related by a ratio of integers to the frequency of said synchronizing signal.

References Cited in the file of this patent

UNITED STATES PATENTS 2,067,366 Whitaker -------------- Jan. 12, 1937

OTHER REFERENCES

Electronics, August 7, 1959, p. 61.

Electronics, November 27, 1959, pp. 60–64.